United States Patent [19]

Long

[11] Patent Number: 5,166,607
[45] Date of Patent: Nov. 24, 1992

[54] METHOD AND APPARATUS TO HEAT THE SURFACE OF A SEMICONDUCTOR DIE IN A DEVICE DURING BURN-IN WHILE WITHDRAWING HEAT FROM DEVICE LEADS

[75] Inventor: Jon M. Long, Livermore, Calif.

[73] Assignee: VLSI Technology, Inc., San Jose, Calif.

[21] Appl. No.: 708,957

[22] Filed: May 31, 1991

[51] Int. Cl.[5] .................... G01R 35/00; G01R 31/02
[52] U.S. Cl. .................... 324/158 F; 324/158 R; 324/73.1; 165/80.4; 165/104.33
[58] Field of Search ............ 324/158 R, 158 F, 73.1; 361/383, 385; 219/209, 210; 165/80.3, 58, 80.5, 80.4, 104.33; 437/8

[56] References Cited

U.S. PATENT DOCUMENTS

| | | | |
|---|---|---|---|
| 4,253,515 | 3/1981 | Swiatosz | 165/80.2 |
| 4,553,020 | 11/1985 | Val | 219/209 |
| 4,567,432 | 1/1986 | Buol et al. | 324/158 F |
| 4,881,591 | 11/1989 | Rignall | 324/158 F |
| 4,982,153 | 1/1991 | Collins et al. | 324/158 F |
| 5,014,904 | 5/1991 | Morton | 357/82 |

Primary Examiner—Vinh Nguyen
Attorney, Agent, or Firm—Majestic, Parsons, Siebert & Hsue

[57] ABSTRACT

A method and apparatus are disclosed for burning-in semiconductor devices. The method includes the steps of: (1) heating the surface of the semiconductor device; (2) cooling the leads of the semiconductor device package so as to maintain the temperature of the outer portions of the leads at, near, or below room temperature; and optionally (3) causing circuits on the semiconductor device to operate electrically while it is being heated. An apparatus for implementing the aforementioned method is also disclosed. In a first embodiment, the apparatus comprises a base plate for heating the surface of the semiconductor device, a cooling plate for cooling the leads of the semiconductor device package, and optionally an electrical testing device for causing the semiconductor device to operate electrically during the heating process. In a second embodiment, the apparatus comprises the same elements as the first embodiment except that the cooling plate is replaced by a heat sink having a plurality of heat dissipating fins. The present method and apparatus eliminates the need for the bulky and expensive ovens previously used for burn-in.

21 Claims, 3 Drawing Sheets

METHOD AND APPARATUS TO HEAT THE SURFACE OF A SEMICONDUCTOR DIE IN A DEVICE DURING BURN-IN WHILE WITHDRAWING HEAT FROM DEVICE LEADS

BACKGROUND OF THE INVENTION

This invention relates to semiconductor device manufacturing and more particularly to a method and apparatus for effecting burn-in of a semiconductor device.

Over the years, the semiconductor industry has continually strived to reduce the size of devices. As a result of that effort, the devices of today are much smaller than those of just a few years ago. In fact, the technology has progressed to such a level that the packaging of the devices has become a major problem. The devices are becoming so minuscule that the conventional packaging techniques presently used are proving to be inadequate.

To illustrate this problem, a partially assembled conventional semiconductor package is shown in FIG. 1 comprising a semiconductor die 10 having a plurality of die pads 12, and a lead frame 14 with a plurality of conductive leads 16. For the sake of simplicity, only one set of leads 16 is shown in the figure. The die 10 is attached to the central portion of the lead frame 14, and each of the leads 16 is electrically connected to a corresponding die pad 12 via a bonding wire 18. The wires 18 are connected to both the leads 16 and the die pads 12 by way of an ultrasonic or thermosonic welding process.

The distance 22 between two adjacent die pads is defined as the pad pitch. As the semiconductor device 10 becomes smaller in size, the pad pitch also decreases. At a certain point, the pad pitch becomes so small that the leads 16 begin to come into contact with each other, causing shorts. Due to the limitations of the mechanical stamping procedure by which lead frames are produced, the separation between leads 16 cannot be made smaller than a certain limiting pitch. This limit has been found to be approximately 10 mils, which effectively sets a lower limit on the size of the die for which lead frames can be used. The wafer fabrication technology in existence today can produce dies smaller than the smallest that can still be used on a lead frame. It is therefore desirable to employ a different packaging technique that is not as limited as lead frames.

Due to the physical limitation of lead frames, a new packaging technique commonly known as tape automated bonding (TAB) has emerged. A typical TAB package (partial assembly) is illustrated in FIG. 2 comprising a layer of tape or film 30 having a plurality of conductive leads 36 on it formed by deposition and etching in a lithographic process, and a semiconductor die 32 with a plurality of die pads 34. A cross sectional view of a pair of leads 36 is provided in FIG. 3 to further illustrate this package.

To form the leads on the tape, a layer of copper 38 is first glued onto the tape 30. A layer of photo resist (not shown) is then put onto the copper layer 38. Thereafter, selected portions of the photo resist layer are exposed to ultraviolet radiation to outline a lead pattern on the tape 30. The individual copper leads 38 are then formed by etching away selected portions of the copper layer. Because copper oxidizes at a rapid rate when exposed to air, a second layer of conductive material 40 is used to cover the copper to prevent this oxidation. The conductive material 40 is usually imposed upon the copper leads 38 through a process called electroplating. This process enables the conductive material 40 to adhere only to the metallic surface (that is, the copper leads 38) and not to the tape 30. Using the process just described, leads such as those shown in FIG. 3 are formed. The second conductive layer 40 is usually composed of tin or gold and for that reason, most tapes are referred to as either tin plated or gold plated tape.

After the leads are formed, they are brought into contact with die pads 34 of the semiconductor die 32 and bonded thereto (FIG. 2). Notice that no bonding wires are necessary because each lead is directly bonded to each die pad. Because the conductive leads 36 are patterned on tape 30 using lithographic fabrication techniques, the widths of leads 36 may be made much thinner than those made by a mechanical stamping procedure or a conventional etching procedure such as that used for a lead frame. The smallest pad pitch a TAB package can presently accommodate is approximately 4 mils. This allows quite a significant reduction in the size of the semiconductor device.

The choice between tin or gold plated tape involves a trade off between cost and ease of manufacturing. From a semiconductor manufacturing standpoint, gold plated tape is preferable because there are very few problems associated with the production of gold plated tape. The cost of gold, though, is three times that of tin. Moreover, the price of gold is volatile whereas the price of tin is relatively stable. Thus, tin would seem to be the better choice. However, there are a number of problems associated with tin plated tape. The first problem, with reference to FIG. 4, is that the copper and tin, after a while, begin to form an intermetallic layer 42. Given sufficient time, this intermetallic layer will grow until it encompasses the entire lead. While this intermetallic layer does protect the copper in the lead frame, the formation of this intermetallic layer before bonding is undesirable because it forms poor connections when it is soldered. It is quite important that the leads form good connections when soldered because soldering is usually the method by which the TAB package is actually attached to a printed circuit board.

Another problem with tin plated tape is that tin forms an insulating oxide when exposed to the atmosphere. It does not oxidize as quickly as copper but it nonetheless does oxidize. If the TAB package is exposed to the atmosphere for too long, the entire tin layer will oxidize leaving only an oxidation layer, an intermetallic layer, and the copper lead. This is undesirable for several reasons. First, the oxidation layer is an insulator. Therefore, it would have to be removed before the lead could be attached to a circuit board. Second, during the soldering process, the intermetallic layer does not form solid bonds when soldered so that even if the oxidation layer were removed, the lead could not be securely attached to a circuit board. The formation of the intermetallic layer and the oxidation layer are time dependent so that once a semiconductor device is packaged, there is only a short period of time during which the package must be attached to a printed circuit board. After that time, it would be difficult for the leads of the tape to be soldered, and to be physically and electrically connected securely to the circuit board either due to the formation of the intermetallic layer or due to the formation of the oxide. The time period between the actual packaging of the semiconductor device and the time at which the package must be attached to a circuit board is defined as the shelf life of the package. The package must be shipped from the manufacturer to the customer within the shelf life of the package in order to enable the customer to attach the package to a circuit board. A long shelf life would obviously be desirable. The formation of the intermetallic layer and the oxidation layer are also temperature dependent as explained below.

The shelf life problem of tin plated tape is exacerbated by the burning-in of the semiconductor device on the tape. Burn-in is a routine procedure used by semiconductor manufacturers to detect defects in semiconductor devices. The burn-in procedure is usually carried out by inserting the entire device package into an oven and heating the assembly at a specified temperature for a certain period of time. The device is caused to operate electrically during this time to ensure that it is functionally sound. Because the formation of the intermetallic and the oxidation layers on the leads of the package are temperature dependent as well as time dependent, the heating of the package accelerates the growth of these layers which, in turn, shortens the shelf life of the device package. The shelf life of a typical tin plated TAB package before burn-in ranges from forty eight hours to several months. If burn-in were performed, the shelf life would be reduced to zero. For this reason, tin plated TAB devices are currently not being burned-in. This significantly increases the chance that a customer will receive a device having a defect. Since this is obviously undesirable, a need exists for a method and apparatus for performing burn-in which does not accelerate the growth of the intermetallic and oxidation layers.

Another undesirable aspect of the prior art burn-in apparatus is that the ovens used to heat the devices are bulky, expensive, and requires a considerable amount of floor space. A burn-in apparatus which eliminates the need for ovens would also be desirable.

Therefore, an object of the invention is to provide a method and apparatus for burning in semiconductor devices which does not accelerate the growth of the intermetallic and oxidation layers on the leads of the packages.

Another object of the invention is to provide a burn-in apparatus which is considerably smaller in size than the ovens currently used.

Yet another object of the invention is to provide a burn-in apparatus which can be economically produced.

SUMMARY OF THE INVENTION

This invention is based on the observation that, to effectively burn-in a semiconductor device, only the surface of the semiconductor die needs to be heated to the burn-in temperature. It is not necessary to heat the entire assembly (comprising the die and the leads).

In accordance with this observation, the present invention provides a method for burning in semiconductor devices which does not require the heating of the entire semiconductor assembly. According to the invention, only the surface of the device is heated to a specified temperature for a specified period of time. To reduce the amount of heat from the device from conducting to and, thereby, raising the temperature of the leads, the leads of the device are cooled and maintained at, around, or below room temperature. Therefore, the burning in process does not accelerate the growth of the oxide or the intermetallic layer in the leads. In effect, the shelf life of the device after burn-in is approximately the same as that before burn in.

The present invention also provides an apparatus for carrying out the burn-in process described above. In a first embodiment, the burn-in apparatus comprises a base plate for heating the die surface to a specified temperature, a cooling plate thermally coupled to the leads of the device for maintaining the leads at a preset temperature, which may be room temperature, and a testing device for causing circuits of the device to operate electrically while the surface of the die is at the elevated temperature. The cooling plate comprises cooling coils encased by a conductive material. Cooling fluid courses through the cooling coils to maintain the leads at or below room temperature.

In a second embodiment, the burn-in apparatus of the invention comprises all of the elements of the first embodiment except that the cooling plate is replaced by a heat sink having a plurality of heat dissipating fins.

DETAILED DESCRIPTION OF THE INVENTION

The burn-in process has been used by semiconductor manufacturers for many years to test the structural and electrical integrity of semiconductor devices. Heating ovens have been the most popular apparatus used for carrying out this process. Although these ovens are bulky and expensive, they are effective for burning-in devices which have been packaged using lead frames. However, as previously discussed, ovens cannot be used to burn-in devices which have been packaged using tin plated TAB packages (hereinafter, TAB packages) because of the oxidation and intermetallic formation problems inherent in these packages. The present invention provides a burn-in method and apparatus which does not require the use of bulky ovens.

Figure 1:
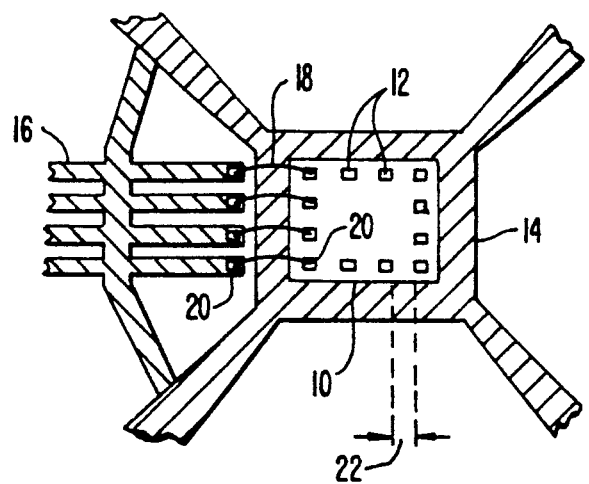
FIG. 1 is a top view of a typical prior art semiconductor device package using a lead frame.
Figure 2:
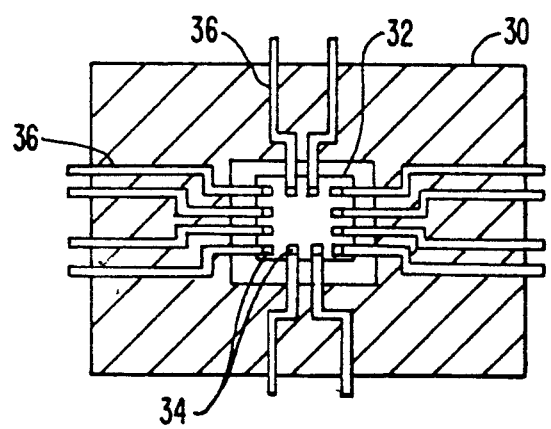
FIG. 2 is a top view of a prior art semiconductor device package using tape automated bonding techniques.
Figure 3:
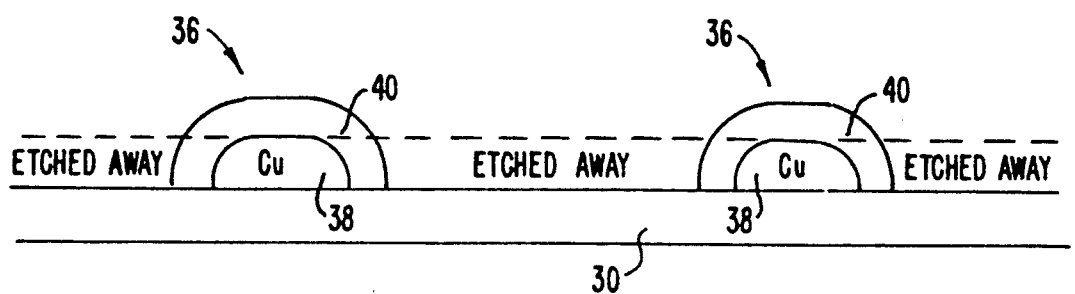
FIG. 3 is a cross-sectional view of an electrically conductive lead of the semiconductor package of FIG. 2.
Figure 4:
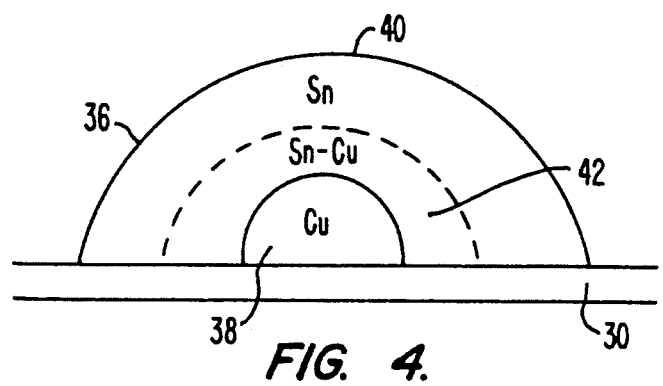
FIG. 4 is a cross-sectional view of an electrically conductive lead of the semiconductor package of FIG. 2 illustrating the intermetallic layer formed by the interaction of copper and tin.
Figure 5:
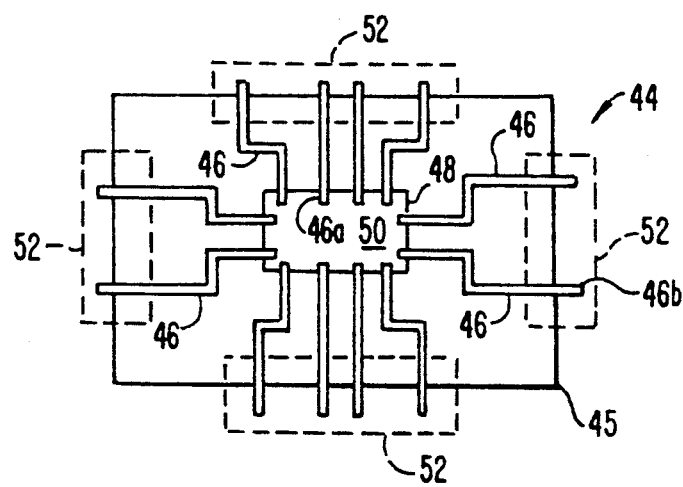
FIG. 5 is a top view of a typical tin plated TAB package to aid in describing the method of the invention.

The present invention is based on the observation that, to effectively burn-in a device, only the surface of the semiconductor die containing electronic devices needs to be heated to the burn-in temperature. It is not necessary to heat the entire package. With reference to FIG. 5, which shows a typical tin plated TAB package 44 comprising tape 45, semiconductor die 48, and conductive leads 46, the method of the invention will now be described. Leads 46 each has an inner end 46*a* near the die and outer end 46*b* extending away from the die, where outer portion 52 comprises the portion of the lead away from the die. At the time of the burn-in, the inner end 46*a* near the die is already bonded to the die so that formation of the intermetallic is actually beneficial, but the outer end 46*b* has not been bonded to a substrate such as a printed circuit board, so that formation of the intermetallic at such end is undesirable.

According to the invention, the semiconductor device 48 is burned-in by first heating only the surface 50 of the device to the burn-in temperature for a specified period of time. Typical burn-in temperatures and times are as follows: (1) 125 degrees Celsius for 168 hours; and (2) 150 degrees Celsius for 48 hours. These are only typical guidelines used by the industry. Actual temperatures may range from 125 to 160 degrees Celsius and burn-in times may be as long as the manufacturer wishes. It is desirable to burn-in a device for as long a time as possible since this increases the chance that a defective device will be detected. However, the burn-in time will be limited by practical considerations such as cost, convenience, and in the case of TAB packages, shelf life. It must be remembered that the shelf life of a tin plated TAB package even without burn-in is relatively short (48 hours to several months). For this reason, without using the invention, tin plated TAB packaged semiconductor devices may not be burned-in for an excessively long period of time.

Although only the surface 50 of the device 48 is heated, this does not mean that the intermetallic and oxidation growth on the leads 46 will not be affected. Because leads 46 are metallic, and thus thermally conductive, the heat applied to the die 48 will eventually conduct and reach the leads 46. This, in turn, will increase the temperature of the leads 46, thereby, accelerating the growth of the intermetallic and oxidation layers on them. The hastening of the growth of these layers is not detrimental where the inner portions of the leads 46 are concerned because the inner ends of the leads are already attached to the semiconductor device 48. However, it is quite important to prevent the acceleration of the growth of these layers on the outer portions 52 of the leads because these outer portions 52 still need to be soldered to a printed circuit board (PC board). As previously mentioned, the intermetallic formed by copper and tin results in a weak and brittle bond when an outer portion 52 is soldered to a PC board. Therefore, the growth of this layer must not be accelerated. To prevent this from taking place, the outer portions 52 of the leads 46 must be maintained at a temperature which is at, near, or below room temperature. For this reason, a second step of the method of the invention is to remove heat from the outer portions 52 of the leads so as to maintain the temperature of the outer portions at, around, or below room temperature.

As a third and last step of the invention, it is preferable to cause circuits (not shown in FIG. 5) on the device 48 to operate electrically during the entire period in which the device 48 is heated to the burn-in temperature. This allows any electrical defects in the device to be detected. In this manner, both the structural and the electrical integrity of the device may be tested.

Figure 6:
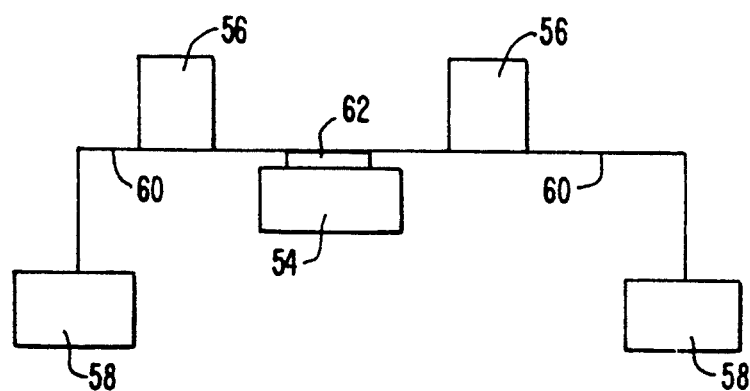
FIG. 6 is a representative diagram of the apparatus of the invention depicting the major components of the invention.

An apparatus for implementing the method of the invention will now be described. With reference to FIG. 6 wherein a representative diagram of the apparatus is shown, the apparatus of the invention comprises a heating means, 54 for applying heat to a surface of the semiconductor die 62, cooling means 56 thermally coupled to the outer portions of the leads 60 of the package for maintaining the temperature of the outer portions at, near, or below room temperature, and an electrical testing means 58 for causing the semiconductor device 62 to operate electrically while it is being heated.

Figure 7:
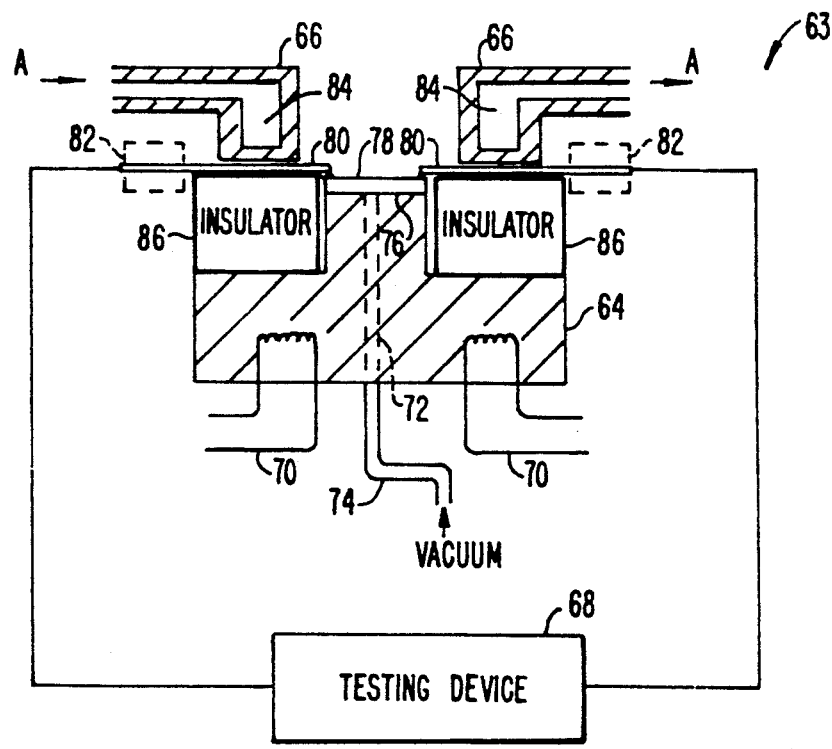
FIG. 7 is a side view of a first embodiment of the apparatus of the invention.

A side view of a first possible embodiment 63 of the apparatus of FIG. 6 is depicted in FIG. 7 wherein the heating means is one base plate 64, the cooling means is one cooling plate 66, and the electrical testing means is testing device 68. Obviously more than one base plate and cooling plate may be used. Base plate 64 is preferably a solid mass of thermally conductive material such as copper or aluminum with heating coils 70 imbedded therein to heat the plate to a specified temperature. Base plate 64 also preferably has a hollow cylindrical shaft 72 passing through its center so that a vacuum tube 74 may be inserted into the base plate 64 to provide the suction necessary to pull the semiconductor device 78 into the base plate to establish a solid thermal contact. Once contact is established, the base plate 64 begins to heat the surface 76 of the die 78 to the desired burn-in temperature. When the backside 76 of device 78 is at the desired burn-in temperature, the circuits on the front surface would also be at temperatures about the same as the desired burn-in temperature; alternaively, a temperature sensor (not shown) may be employed to sense the temperature of the front surface of device 78 and the heating coils 70 controlled in response to the sensor output so as to achieve the desired burn-in temperature at the circuits on the front surface of device 78.

Since the leads 80 are both electrically and thermally conductive, heat from the base plate 64 and the die 78 will eventually reach the outer portions 82 of the leads. To prevent this from happening, at least one annular cooling plate 66 is thermally coupled to the intermediate portions of the leads 80 to drain off any excess heat from the leads before it reaches the outer portions 82. Cooling plate 66 is preferably composed of a mass of conductive material, such as copper or aluminum, with a cooling cavity 84 within the plate. A cooling fluid such as freon courses through the cooling cavity 84 along the direction of arrows A to carry away any excess heat. One advantage of this embodiment is that, since the cooling is achieved using a cooling fluid, it is possible to maintain the temperature of the leads 80 below room temperature. This may be desirable in some situations.

The imposition of the cooling plate 66 onto the leads 80 puts a considerable amount of strain on the leads. To ensure that the leads do not break or bend, thermal insulators 86 need to be inserted between the base plate 64 and the leads 80 to provide structural support. It is important that the insulators fit snugly to minimize any stress imposed on the leads 80 by the cooling plate 66. The insulators may be made of plastic or any of a number of different materials. As long as the material is a good thermal insulator and its melting point is above 160 degrees Celsius, it can be used in this application.

The final element of the embodiment shown in FIG. 7 is the testing device 68 which is electrically connected to the outer portions 82 of the leads to cause circuits (not shown in FIG. 7) of the semiconductor device 78 to operate while its temperature is elevated. Testing device 68 is well known in the art and need not be described herein. However, even though it is well known in the art, testing device 68 is still an integral part of the apparatus of the invention. Without it, the electrical integrity of the semiconductor device 78 could not be tested.

Figure 8:
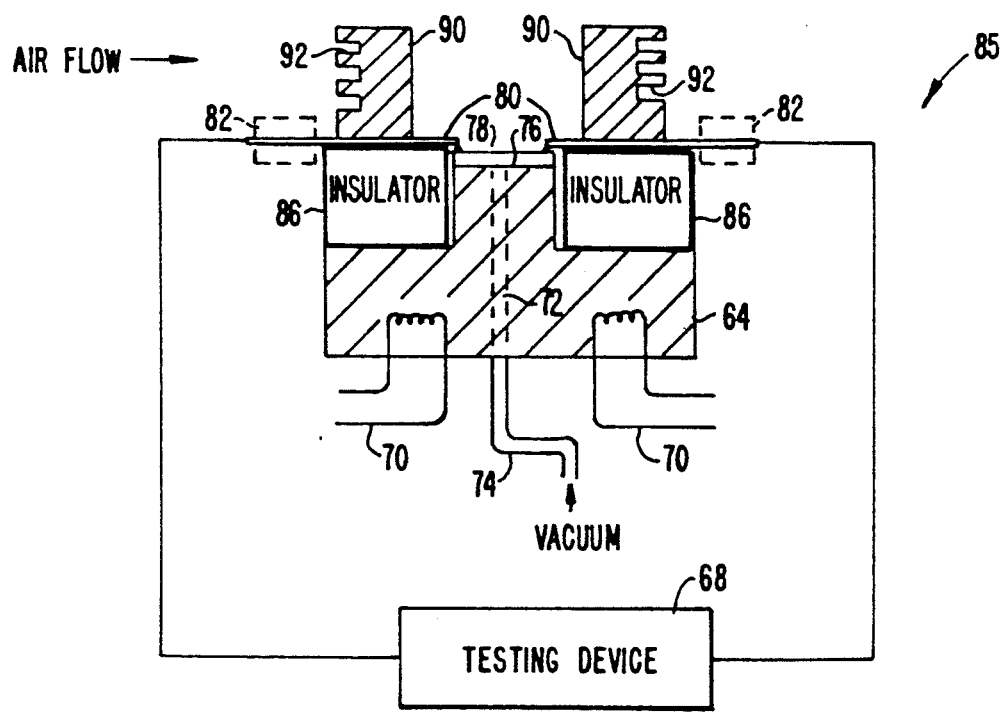
FIG. 8 is a side view of a second embodiment of the apparatus of the invention.

FIG. 8 provides a side view of a second embodiment of the apparatus of the invention. With reference to FIG. 8, this second embodiment comprises the same elements as the first embodiment except that the cooling plate is replaced by a heat sink 90 having a plurality of heat dissipating fins 92. Obviously more than one heat sink may also be used. The heat sink 90 is preferably composed of a thermally conductive material such as copper or aluminum so that it effectively draws heat away from the leads 80 towards the fins 92. Once at the fins 92, the heat will be carried away by any air flowing through the fins. One advantage of this configuration is that it is simple and inexpensive to implement. All that is needed is a block of thermally conductive material with fins. No complex system of fluid flow is required. One of the disadvantages of this embodiment is that it is only capable of, at most, lowering the temperature of the leads to that of room temperature. Most of the time, it will not even do that. Another disadvantage is that it requires air flow to be effective. Where the surrounding air is stagnant, this embodiment will not produce satisfactory results. In most burn-in applications, however, the air is not stagnant and the temperature of the leads need only be kept near room temperature. Thus, this configuration is generally quite adequate.

To reduce the rate of growth of the oxide layer and the formation of the tin-copper intermetallic, it is preferable to cool the outer portions of the leads 52, 82 to a temperature in the range of about 25° C. to 35° C., although a temperature in the range of about 0° C. to 50° C. may be suitable as well. From the discussion above, it will be evident that the growth or formation of these undesirable layers is slower at lower temperatures, so that it is desirable to cool the outer portions to as low a temperature as possible. On the other hand, it will be difficult, as a practical matter, to maintain the outer portions of leads at very low temperatures because of the enormous temperature gradient that must be maintained between ends 46a and the outer portions of the leads and the enormous cooling apparatus that must be used to achieve such gradient.

The invention as described achieves all of the desired objectives. First of all, semiconductor devices packaged using tin plated TAB packages may now be burned-in since the burn-in process no longer accelerates the growth of the oxidation and intermetallic layers in the leads. Second, the burn-in apparatus of the invention eliminates the need for ovens so that expensive and bulky ovens no longer need to be tolerated. Finally, the apparatus of the present invention can be economically produced. Overall, the invention provides a superior method and apparatus for burning-in semiconductor devices.

It should be noted that although the invention has been described with reference to specific embodiments, it should not be construed to be so limited. Many modifications may be made by one of ordinary skill in the art with the benefit of this disclosure without departing from the spirit of the invention. For example, although the heating means has been described as being a base plate, it should be understood that other heating means may be employed as a heat source. For instance, it is conceivable that infrared radiation may be used to heat the surface of the semiconductor to the desired burn-in temperature. This is within the scope of the invention. Also, cooling means other than those described may be used to maintain the temperature of the leads at an acceptable level. Furthermore, even though the invention is described in conjunction with tin plated TAB packages, semiconductor devices packaged using other types of techniques (e.g. the quad flat package) may also be burned-in using the method and apparatus of the invention. These and other modifications may be made within the spirit of the invention. Therefore, the invention should not be limited by the embodiments used to illustrate it but only by the scope of the appended claims.

What is claimed is:

1. A method for burn-in of a semiconductor device, said device comprising a semiconductor die, said die having electrical circuits, and a plurality of electrically conductive leads, a first end of said leads being electrically connected to selected portions of said die, a second end of said leads extending outward away from said die, the portion of said leads extending away from said die being defined as the outer portion of said leads, said method comprising the steps of:
   (a) applying heat to a surface of said die to maintain said surface or another surface of the die at a first specified temperature for a first specified period of time;
   (b) removing heat from said leads to maintain the outer portion of said leads at or near a second specified temperature for said first period of time; and
   (c) applying an electronic signal to the outer portion of the leads.

2. The method of claim 1, wherein heat is applied directly and only to said die surface.

3. The method of claim 2, wherein said first temperature is approximately 125° C. and said first period of time is at least 48 hours.

4. The method of claim 3, wherein said second temperature is in a range of approximately 25° to 35° C.

5. The method of claim 2, wherein said first temperature is approximately 150° C. and said first period of time is at least 24 hours.

6. The method of claim 5, wherein said second temperature is in a range of approximately 25° to 35° C.

7. The method of claim 1, wherein said second temperature is in a range of approximately 0° to 50° C.

8. The method of claim 1, wherein said removing step includes passing a fluid in thermal contact with said leads.

9. The method of claim 8, wherein said fluid has been cooled to a temperature below room temperature.

10. An apparatus for burn-in of a semiconductor device, said device comprising a semiconductor die and a plurality of electrically conductive leads, said die having electrical circuits on a die surface, a first end of said leads being electrically connected to selected portions of said die, a second end of said leads extending outward away from said die, the portion of said leads extending away from said die being defined as the outer portion of said leads, said testing apparatus comprising:
   means for applying heat to a surface of said die to maintain said die surface having circuits thereon at a first specified temperature for a first specified period of time;
   cooling means thermally coupled to said leads for maintaining the temperature of the outer portions of said leads at or near a second specified temperature for said first specified period of time; and
   means electrically connected to the outer portion of said leads for causing the circuits of said semiconductor die to operate electronically while heat is applied to said die.

11. The apparatus of claim 10, wherein said heat applying means applies heat directly and only to a portion of the die at or near said die surface having circuits thereon.

12. The apparatus of claim 11, wherein said heat applying means is a thermally conductive base plate which directly contacts said die surface for applying heat thereto, said base plate being heated by at least one heating coil.

13. The apparatus of claim 10, wherein said cooling means comprises means for passing a fluid in thermal contact with the leads.

14. The apparatus of claim 13, wherein said fluid is at a temperature lower than room temperature.

15. The apparatus of claim 13, said cooling means including a thermally conductive body with a conduit therein for passage of the fluid, said conductive body being thermally coupled to said leads between the first end and the outer portion for removing heat therefrom.

16. The apparatus of claim 10, wherein said cooling means is a thermally conductive mass having a plurality of heat dissipating fins.

17. The apparatus of claim 10, wherein said first temperature is approximately 125° C. and said first period of time is at least 48 hours.

18. The apparatus of claim 17, wherein said second temperature is in a range of approximately 25° to 35° C.

19. The apparatus of claim 10, wherein said first temperature is approximately 150° C. and said first period of time is at least 24 hours.

20. The apparatus of claim 19, wherein said second temperature is in a range of approximately 25° to 35° C.

21. The apparatus of claim 10, wherein said second temperature is in a range of approximately 0° to 50° C.

* * * * *